(12) United States Patent
Charpentier et al.

(10) Patent No.: US 8,707,146 B2
(45) Date of Patent: Apr. 22, 2014

(54) METHOD AND SYSTEM FOR STOPPING EXECUTION OF A TURBO DECODER

(75) Inventors: Sébastien Charpentier, Caen (FR); Andrea Ancora, Nice (FR)

(73) Assignee: Ericsson Modems SA, Geneva (CH)

( * ) Notice: Subject to any disclaimer, the term of this patent is extended or adjusted under 35 U.S.C. 154(b) by 824 days.

(21) Appl. No.: 12/865,702

(22) PCT Filed: Feb. 5, 2009

(86) PCT No.: PCT/EP2009/000797
§ 371 (c)(1),
(2), (4) Date: Nov. 19, 2010

(87) PCT Pub. No.: WO2009/098059
PCT Pub. Date: Aug. 13, 2009

(65) Prior Publication Data
US 2011/0055657 A1  Mar. 3, 2011

(30) Foreign Application Priority Data
Feb. 5, 2008  (EP) ..................................... 08290100

(51) Int. Cl.
*H03M 13/03*  (2006.01)
(52) U.S. Cl.
USPC ........................................................ 714/794
(58) Field of Classification Search
USPC ........................................................ 714/794
See application file for complete search history.

(56) References Cited

U.S. PATENT DOCUMENTS

| | | | |
|---|---|---|---|
| 6,182,261 B1 * | 1/2001 | Haller et al. | 714/758 |
| 6,665,357 B1 * | 12/2003 | Somayazulu | 375/341 |
| 7,093,180 B2 * | 8/2006 | Shin et al. | 714/755 |
| 8,468,418 B2 * | 6/2013 | Yang et al. | 714/758 |
| 2001/0047501 A1 * | 11/2001 | Sindhushayana et al. | 714/755 |
| 2002/0010892 A1 * | 1/2002 | Lodge et al. | 714/777 |
| 2002/0184596 A1 * | 12/2002 | Dinc et al. | 714/794 |
| 2003/0066018 A1 * | 4/2003 | Yu et al. | 714/792 |
| 2005/0071726 A1 * | 3/2005 | Kutz et al. | 714/755 |
| 2005/0097431 A1 * | 5/2005 | Nieminen | 714/794 |
| 2008/0092025 A1 * | 4/2008 | Hedayat et al. | 714/792 |

FOREIGN PATENT DOCUMENTS

| | | |
|---|---|---|
| EP | 1 217 776 A2 | 6/2002 |
| EP | 1 217 776 A3 | 8/2003 |
| GB | 2 403 106 A | 12/2004 |

OTHER PUBLICATIONS

PCT International Search Report and Written Opinion, PCT/EP2009/000797, mailing date Feb. 2, 2010, 4 pages, European Patent Office, Rijswijk, NL.

(Continued)

*Primary Examiner* — Joshua Lohn
(74) *Attorney, Agent, or Firm* — William J. Kubida; Peter J. Meza; Hogan Lovells US LLP

(57) ABSTRACT

A method for conditionally stopping execution of a turbo decoder is proposed. The decoder has elementary decoders. Each elementary decoder performs a sequence of decoding operations and is arranged to receive an input from at least one other elementary decoder. The method determines for each specific decoding operation if the sequence of elementary decoding operations of the specific elementary decoder has substantially converged or substantially diverged. The method terminates the execution of decoding operations if a number of sequences has substantially converged or substantially diverged.

5 Claims, 4 Drawing Sheets

801. $(X_n = X_{n-1})$
802. $(X_n = X_{n-1} = X_{n-2})$
803. $(A_n = B_n)$
804. $(A_n = A_{n-1} = B_n = B_{n-1})$
805. $(A_n = A_{n-1} = A_{n-2} = B_n = B_{n-1} = B_{n-2})$
806. $(X_n = X_{n-1})$ OR $(A_n = B_n)$
807. $((A_n = A_{n-1})$ AND $(B_n = B_{n-1}))$ OR $(A_n = B_n)$
808. $((A_n = A_{n-1})$ AND $(B_n = B_{n-1}))$ OR $(A_n = A_{n-1} = B_n = B_{n-1})$
809. $((A_n = A_{n-1} = A_{n-2})$ AND $(B_n = B_{n-1} = B_{n-2}))$ OR $(A_n = A_{n-1} = B_n = B_{n-1})$
810. $((A_n = A_{n-1} = A_{n-2})$ AND $(B_n = B_{n-1} = B_{n-2}))$ OR $(A_n = A_{n-1} = A_{n-2} = B_n = B_{n-1} = B_{n-2})$

(56) References Cited

OTHER PUBLICATIONS

Barbulescue, Adrian S. and Pietrobon, Steven S., "Turbo Codes: A Tutorial on a New Class of Powerful Error Correcting Code Schemes", Part I: Code Structures and Interleaver Design, IREE, Feb. 1999, pp. 129-141.

Barbulescue, Adrian S. and Pietrobon, Steven S., "Turbo Codes: A Tutorial on a New Class of Powerful Error Correcting Code Schemes", Part II: Decoder Design and Performance, IREE, Feb. 1999, pp. 143-150.

Matache, A., Dolinar, S., and Pollara, F., "Stopping Rules for Turbo Decoders", TMO Progress Report 42-142, Aug. 15, 2000, pp. 1-22.

\* cited by examiner

801. $(X_n = X_{n-1})$
802. $(X_n = X_{n-1} = X_{n-2})$
803. $(A_n = B_n)$
804. $(A_n = A_{n-1} = B_n = B_{n-1})$
805. $(A_n = A_{n-1} = A_{n-2} = B_n = B_{n-1} = B_{n-2})$
806. $(X_n = X_{n-1})$ OR $(A_n = B_n)$
807. $((A_n = A_{n-1})$ AND $(B_n = B_{n-1}))$ OR $(A_n = B_n)$
808. $((A_n = A_{n-1})$ AND $(B_n = B_{n-1}))$ OR $(A_n = A_{n-1} = B_n = B_{n-1})$
809. $((A_n = A_{n-1} = A_{n-2})$ AND $(B_n = B_{n-1} = B_{n-2}))$ OR $(A_n = A_{n-1} = B_n = B_{n-1})$
810. $((A_n = A_{n-1} = A_{n-2})$ AND $(B_n = B_{n-1} = B_{n-2}))$ OR $(A_n = A_{n-1} = A_{n-2} = B_n = B_{n-1} = B_{n-2})$

901. $(A_n = A_{n-1})$ or $(B_n = B_{n-1})$
902. I: $(A_n = A_{n-1})$ OR $(A_n = B_n)$
     II: $(B_n = B_{n-1})$ OR $(A_n = B_n)$

METHOD AND SYSTEM FOR STOPPING
EXECUTION OF A TURBO DECODER

This application claims the benefit of International Application No. PCT/EP2009/000797 filed Feb. 5, 2009 and European Patent Application No. 08290100.0 filed Feb. 5, 2008, both applications are incorporated herein in their entireties by this reference for all purposes as if fully set forth herein.

FIELD OF THE INVENTION

The invention relates to the field of turbo decoders.

In particular, the invention relates to a method for stopping execution of a turbo decoder wherein said turbo decoder comprises a plurality of elementary decoders, wherein:
each respective one of the elementary decoders is configured for performing a respective sequence of decoding operations, and each respective one of the elementary decoders is arranged to receive a respective input from at least one other of the plurality of elementary decoders.

The invention also relates to a turbo decoder system employing a method for stopping the execution of a turbo decoder.

The invention also relates to software for configuring a data processing system.

The invention also relates to a software providing system.

The invention also relates to a software providing method.

BACKGROUND OF THE INVENTION

One class of error correcting codes is that of the so called turbo codes. A turbo code is decoded by a turbo decoder. Turbo decoders are characterized by comprising at least two elementary decoders who cooperate to produce decoded data.

Turbo codes are employed, e.g., in communications protocols, such as used for mobile telephony. For example, a sender, encodes original data using a turbo encoder for use during transmission, a receiver decodes received data using a turbo decoder. During transmission errors may occur. The use of a turbo encoder and turbo decoder allows the correction of some errors. One protocol in which turbo codes are used is the High-Speed Downlink Packet Access (HSDPA) protocol.

Each elementary decoder takes as input the received data and the results of a previous elementary decoding operation, done by another elementary decoder. During execution the elementary decoders work on so-called soft data. Soft data gives probabilistic information on the data that was originally sent. In addition the soft data may comprise bit reliabilities. The elementary decoders need to be able to use soft data, for example, SISO decoders (Soft Input Soft Output). The soft data can be transformed into hard data. Hard data consists of a specific guess of what the data, that was originally sent by the sender, was.

The structure and operation of turbo decoders is well known to a person skilled in the art. Turbo decoders are, for example, described in S. A. Barbulescu and S. S. Pietrobon, "Turbo codes: A tutorial on a new class of powerful error correcting coding schemes, Part 1: Code structures and interleaver design", *J. Elec. and Electron. Eng., Australia*, vol. 19, pp. 129-142, September 1999. and S. A. Barbulescu and S. S. Pietrobon, "Turbo codes: A tutorial on a new class of powerful error correcting coding schemes, Part 2: Decoder design and performance," *J. Elec. and Electron. Eng., Australia*, vol. 19, pp. 143-152, September 1999.

A turbo decoder comprises an iterative algorithm comprising a number of iterations. Each iteration comprises the execution of each of the elementary decoders. The classical implementation of this iterative algorithm performs a constant number of iterations independent of the channel condition, such as the signal to noise ratio. The ability to dynamically determine the number of iterations is called "Early stopping". The current state of the art comprises several techniques for early stopping.

One such approach for early stopping is described in U.S. Pat. No. 7,093,180 B2. In U.S. Pat. No. 7,093,180 B2 the turbo decoding is organized in a series of iterations. Each iteration consists of decodings by all the component decoders. At the end of each full iteration it is determined if convergence or divergence has occurred. If so, the iteration is stopped.

A comprehensive overview of the state of the art of early stopping rules is provided by "Stopping Rules for Turbo Decoders"; TMO progress report 42-142; Aug. 15, 2000; A. Matache, S. Dolinar and F. Pollara. Herein a turbo decoder with two elementary decoders is used. The report proposes a first method for early stopping. The first method stops elementary decoding as soon as the outputs of the two elementary decoders are equal. This first method is applied after each elementary decoding. Also a second self-contained method for early stopping is proposed. The second method stops elementary decoding as soon as the second elementary decoder has converged; this rule is only applied after an elementary decoding done by the second elementary decoder.

It is a problem of the prior art that turbo encoders need many elementary decodings.

SUMMARY OF THE INVENTION

It is an object of the invention to reduce the number of elementary decodings that are needed by a turbo decoder.

The inventors have recognized that a problem with the prior art lies in the granularity of applying stopping rules. When halfway in an iteration it could be determined that the execution of the turbo decoder can be terminated then it is possible to save one half of the iteration. This saving is especially non-negligible for HSDPA with a block size greater than 5000 bit. This type of savings is also especially relevant for devices with limited resources, such as mobile phones.

The advantages include reduced power consumption and reduced decoding latency. In this way a better compromise between latency and reliability of the decoded data is achieved.

The terminating is done if a number of sequences including the specific sequence has substantially converged or substantially diverged. This includes the method whereby only the specific sequences converges or diverges. This includes the method whereby the specific sequences converges or diverges and at least one other sequence converges or diverges. Instead of looking for converging or diverging the method can also only consider converging, or only consider diverging. The method could also look for one sequence that converges and one other sequence that diverges.

Considering the convergence or divergence of a single sequence has the advantage that less memory is needed.

Considering the convergence or divergence of at least two sequences has the advantage that the robustness of the method is increased, i.e., it becomes less likely that the termination is done in inappropriate situations.

The inventors have recognized that it is advantageous to stop the execution of a turbo decoder in case it is unlikely that the turbo decoder will eventually come up with a correct decoding. If two sequences corresponding to two elementary decoders have both converged, but not to the same data then the process is stable. In that case it is not likely that more progress towards a correct output will be made. By having the turbo decoder reporting this eventuality, a communication system comprising the turbo decoder can take further action. For example, the communication system could request the resending of the data, or it could terminate the application depending on the data. In case the turbo decoder uses more than two elementary decoders the reliability is increased when stopping is done in case of convergence of more than two sequences corresponding to elementary decoders.

The advantages of this method include a faster response to situations where the turbo decoder fails for the above reason, and reduced power consumption in that situation.

It is most efficient if the method of the present invention is applied after each decoding operation. In that case it is detected at the earliest time that a correct decoding has become unlikely, but it also possible to apply the method of the present invention only at the end of an iteration.

It can be convenient to combine the step of determining if a first sequence of decoding operations has converged to a first data with the step of determining if the specific sequence of decoding operations of the specific elementary decoder has substantially converged or substantially diverged.

The inventors have recognized that there is no need to restrict oneself to one type of rule; rather it brings advantages to combine different rules. Since testing for termination is relatively cheap compared to an extra elementary decoding operation, it is opportune to test more than one criterion to maximize the probability of early stopping.

Determining if a first sequence of decoding operations substantially agrees with a second sequence of decoding operations can first involve determining if the first sequence converges; it can also involve testing if the second sequence converges. By combining two determinations for convergence into one step the advantage of faster execution is achieved, also the amount of software or hardware to execute the method is reduced, also the complexity of such software or hardware is reduced.

The turbo decoder system can be configured to use the method using software, or the turbo decoder system may comprise hardware, such as electronic circuits that are configured to perform the method, or the turbo decoder system can be controlled using software, or the turbo decoder system may comprise a combination of possibly dedicated hardware and software to implement the method of the invention. A single device could comprise such a turbo decoder system. On the other hand such a turbo decoder system could also comprise a plurality of separate devices.

Each step of a method according to the invention can be achieved by at least one of the number of processing means. In one embodiment each specific processing means of the number of processing means corresponds to a specific step of the method according to the invention. The programming means can be fabricated using various well known high-level programming languages, such as, C, C++ or Pascal. The programming means can alternatively be fabricated using low-level programming languages such as assembly, machine codes or microcode. A processing means can correspond to an architectural structure, such as a subroutine, or an object, but this is not necessary, and a processing means can also correspond to one or more lines of programming code, or part thereof. A processing means could also be comprised in a larger processing means addressing an ulterior goal of the software.

It is convenient to have a providing system provide the software. For example, a server provides the software by making it available for download, or for streaming, e.g., streaming of control code, via a data network, such as the Internet. Or, as a further example, the providing system comprises a storage unit storing the software from which later the software can be provided by reading from the storage unit. Or the providing system comprises a processing device for enabling such providing, including downloading, streaming or storing.

BRIEF DESCRIPTION OF THE DRAWINGS

The invention is explained in further detail, by way of example and with reference to the accompanying drawings, wherein.

Throughout the Figures, similar or corresponding features are indicated by same reference numerals.

DETAILED EMBODIMENTS

Figure 1:
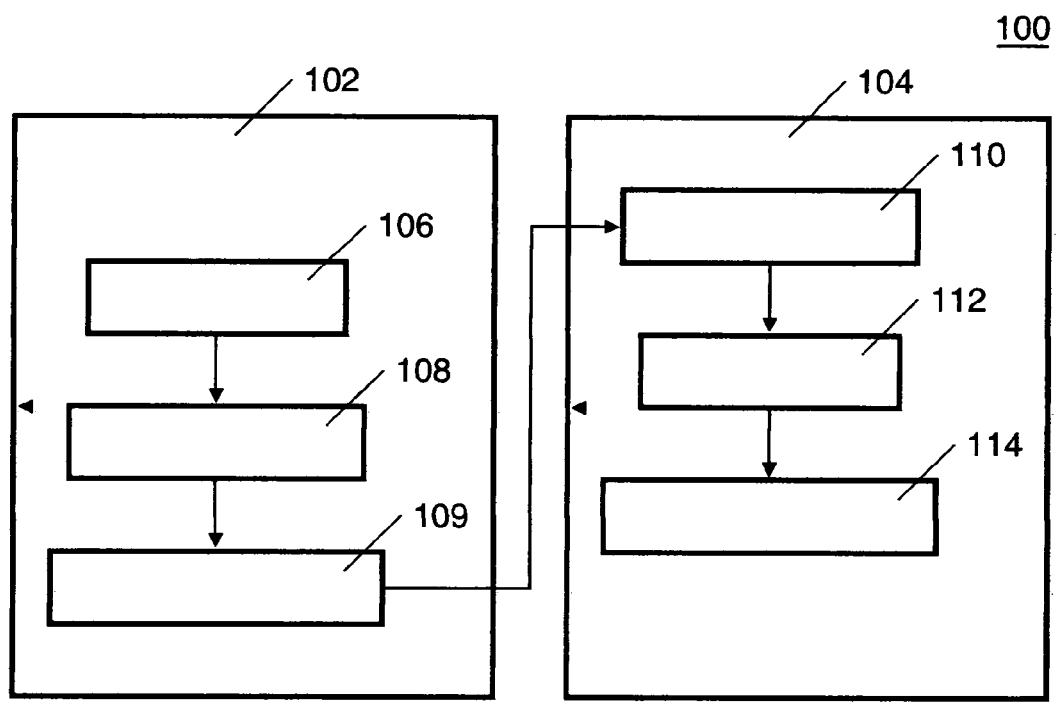
FIG. 1 is a block diagram showing an application of the turbo decoder system according to the invention into a communication system.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described.

For convenience, the method of stopping a turbo decoder is described for a turbo decoder having two elementary decoders; however, the method is applicable to any turbo decoder having at least two elementary decoders.

LEGEND FOR THE FIGURES

Reference Y denotes Yes.
Reference N denotes No.
Reference FIG. denotes Figure.
Reference numeral (100): a communication system.
Reference numeral (102): a sender.
Reference numeral (104): a receiver.
Reference numeral (106): an original data.
Reference numeral (108): a turbo decoder.
Reference numeral (109): a transmitted data.
Reference numeral (110): a received data.
Reference numeral (112): a turbo decoder system.
Reference numeral (114): a decoded data.
Reference numeral (202): an elementary decoder 1.
Reference numeral (204): an elementary decoder 2.

Reference numeral (206): a stopping decision unit.
Reference numeral (300): a hard data unit 1.
Reference numeral (302): a hard data unit 2.
Reference numeral (400): a memory 1.
Reference numeral (402): a memory 2.
Reference numeral (404): a stopping decision logic.
Reference numeral (406): an output of elementary decoder 1.
Reference numeral (408): an output of elementary decoder 2.
Reference numeral (501): Perform a specific elementary decoding operation.
Reference numeral (502): Did the specific sequence converge or diverge?
Reference numeral (504): Terminate the execution of decoding operations.
Reference numeral (602): Did the specific sequence converge?
Reference numeral (604): Did the sequence prior to the specific sequence converge?
Reference numeral (606): Did both sequences converge to the same data?
Reference numeral (608): Report failure.
Reference numeral (702): Does the specific elementary decoding operation substantially agree with the previous one?
Reference numeral (704): Other reasons for stopping?
Reference I in Equation (902): After a decoding operation performed by elementary decoder 1 (202).
Reference II in Equation (902): After a decoding operation performed by elementary decoder 2 (204).

It is first described, and illustrated in FIG. 1, how a turbo decoder system (112) employing the method could be used in a communication system (100), by two entities, viz a sender (102) and a receiver (104). The sender (102) selects an original data (106) and causes it to be used as input for a turbo encoder (108). The turbo encoder (108) computes a transmitted data (109) that is suitable to be used in a communication system, such as a wireless communication system, such as HSDPA, or in a wired communication system, such as a digital network, such as the Internet. The transmitted data (109) is transmitted to the receiver (104). The receiver (104) receives received data (110) and causes it to be used as input for a turbo decoder system (112). The turbo decoder system (112) computes a decoded data (114).

If no errors occur during the transmission of the transmitted data (109), the received data (110) will be equal to the transmitted data (109). However, if the transmission is noisy, errors will occur and the received data (110) will differ from the transmitted data (109).

The turbo decoder attempts to reconstruct the original data (106). If no errors or fewer errors than the turbo decoder system (112) can correct have occurred during transmission then the decoded data (114) will be equal to the original data (106).

It can happen that the turbo decoder fails, for example, if too many errors have occurred and the received data (110) differs too much from the transmitted data (109). In that case the decoded data (114) will be unequal to the original data (106). Even if few errors have occurred there is a chance that decoded data (114) is unequal to the original data (106).

The turbo encoder (108) comprises a plurality of elementary encoders. Each elementary encoder corresponds to a corresponding elementary decoder in the turbo decoder system (112). Each elementary encoder in the turbo encoder (108) adds error correcting data (e.g. parity data) aimed at the corresponding elementary decoder of the turbo decoder system (112). Typically the turbo encoder (108) will also add data aimed at all elementary decoders, typically the latter data will take the form of systematic data, which is representative of the original data, such as a copy, or permutation of the original data. For convenience of exposition it is assumed that the turbo encoder adds systematic data, although this does not restrict the method. The error correcting data and any other data is typically interleaved.

Typically a turbo encoder (108) contains two elementary encoders; typically these elementary encoders are of the convolutional encoder type. Typically a turbo decoder system (112) contains two elementary decoders; typically these elementary decoders are of the convolutional decoder type. Typically these elementary decoders are also of SISO type.

Turbo decoders can also be employed in a storage system. Instead of transmission of the transmitted data (109) the data is stored in a suitable digital storage medium. The receiver (110) can read the received data from the storage medium. In this case the receiver (104) and the sender (102) may be the same entity, although this is not necessary.

As a further example a turbo decoder system (112) can be used in conjunction with digital video broadcasting, satellite communications and space exploring systems.

Figure 2:
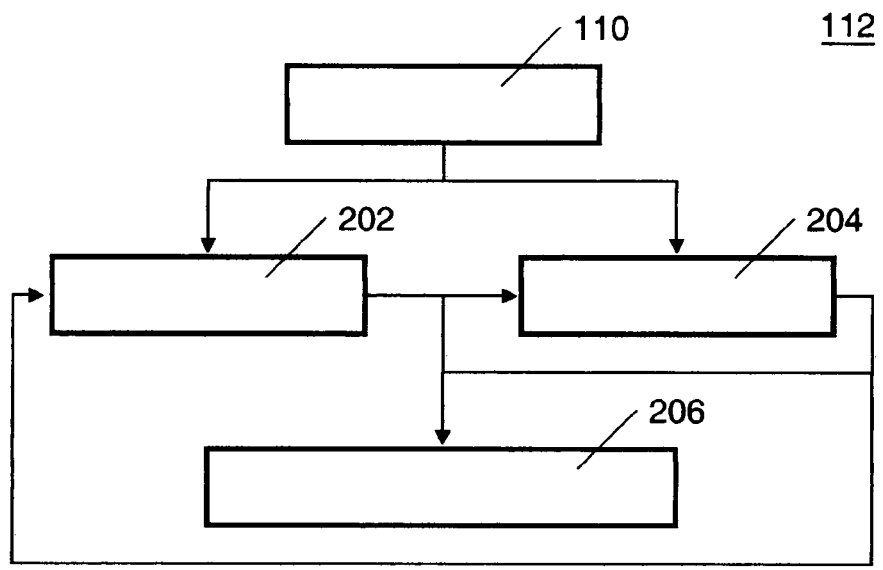
FIG. 2 is a block diagram illustrating a first embodiment of the turbo decoder system according to the invention.

In FIG. 2 a block diagram is shown, illustrating an embodiment of a turbo decoder system (112). Two elementary decoders: elementary decoder 1 (202) and elementary decoder 2 (204) are arranged to receive a received data (110). Elementary decoder 2 (204) is arranged to receive input from elementary decoder 1 (202) and elementary decoder 1 (202) is arranged to receive input from elementary decoder 2 (204). A stopping decision unit (206) is arranged to receive input from elementary decoder 1 (202) and elementary decoder 2 (204).

The stopping decision unit (206) is capable of terminating elementary decoder 1 (202) and elementary decoder 2 (204).

In normal operation elementary decoder 1 (202) first receives the received data (110). Using the systematic data and the error correcting data aimed at elementary decoder 1 (202), the elementary decoder 1 (202) computes data representing information on the original data (106). Typically this data will take the form of probabilities. Typically this data will be expressed in log-likelihood numbers. This type of data is called soft data. A person skilled in the art knows how a turbo decoder operates using soft data.

Next, elementary decoder 2 (204) receives the received data (110) and the output of elementary decoder 1 (202). Using the systematic data, the error correcting data aimed at elementary decoder 2 (204) and the output of elementary decoder 1 (202), the elementary decoder 2 (204) computes data representing information on the original data (106).

Next, elementary decoder 1 (202) receives the received data (110) and the output of elementary decoder 2 (204). Using the systematic data, the error correcting data aimed at elementary decoder 1 (202) and the output of elementary decoder 2 (204), the elementary decoder 1 (202) computes data representing information on the original data (106).

Turbo decoder system (112) continues to work in an iterative fashion, each elementary decoder taking as input the output of the other elementary decoder. On each iteration each elementary decoder computes a new output. Hence for each elementary decoder a sequence is created, a first sequence corresponding to the sequence of data computed by elementary decoder 1 (202) and a second sequence corresponding to the sequence of data computed by elementary decoder 2 (204).

In normal operation, if the error level in the received data (110), as compared with the transmitted data (109), is lower than the number of errors the turbo decoder system can correct, then the first sequence of outputs of the elementary decoder 1 (202) will converge. Likewise the second sequence of outputs of the elementary decoder 2 (204) will converge. Moreover they will converge to the same value. In normal circumstances the soft data of either elementary decoder will then represent the original data closely. At this point the soft data can be transformed into hard data. Whereas the soft data is a complicated and probabilistic representation of information on the original data, the hard data is a bit-pattern representing a best guess of the original data (106) on the basis of soft data. The transformation to hard data and the extraction of the hard data to produce decoded data (114) is not shown in FIG. 2.

The stopping decision unit (206) comprises at least one criterion or rule to decide when the iteration needs to be terminated. The stopping decision unit (206) comprises a method to terminate the elementary decoding operations based on the progress that is made towards a correct decoding. Either the stopping decision unit (206) may decide that the current set of soft data is, when transformed to hard data, likely a good enough approximation of the original data (106). Alternatively the stopping decision unit (206) may decide that the current set of soft data is, when transformed to hard data, likely a bad approximation of the original data (106), and moreover the soft data is not expected to become better in this regard. In both cases further elementary decodings are not needed and can be terminated. The embodiments below describe in further detail the operation of the stopping decision unit (206).

The stopping decision unit (206) can comprise more than one criterion to estimate the progress towards a correct decoding. A rule may also explicitly estimate the lack of progress made towards a correct decoding, or estimate the divergence. Combining more than one criterion makes it more likely that situations in which the elementary decoding can be stopped are recognized early. In addition rules that estimate the progress towards a correct decoding can be combined. For example, the stopping decision unit (206) may terminate if a fixed number of iterations have passed. This rule on the number of iterations can be combined with any other rule. Typically 8 iterations will suffice for most applications.

The turbo decoder system (112) can be made using dedicated hardware, such as electronic circuits that are configured to perform the method, or the turbo decoder system (112) can be made from generic hardware controlled using software, or the turbo decoder system (112) may comprise a combination of dedicated hardware, generic hardware and software to implement the method of the invention.

Since the stopping decision unit (206) has access to elementary decoder 1 (202) and elementary decoder 2 (204) it can terminate the elementary decodings at any point in the process. In particular, there is no reason to restrict the termination to the end of an iteration. As a result, on average, the turbo decoder will finish earlier. As a result the decoded data (114) is available earlier. Since fewer computations are done also the power consumption can be reduced. Alternatively, using the same power consumption and latency a larger turbo code can be used, e.g., a turbo code with a larger block size or a turbo code which can correct more errors, leading to larger bandwidth or better resilience against errors during transmission.

An advantage of deciding on termination using soft data instead of hard data can be that convergence patterns are earlier visible in the soft data. As a result a slightly more aggressive rule may be used. Since soft data represents quantized probability metrics but hard data corresponds instead to a binary hard decision made upon their sign, it is possible to express the point on which to terminate with much less complexity with respect to soft data.

The stopping decision unit (206) can terminate elementary decoder 1 (202) and elementary decoder 2 (204) by physically stopping them from decoding. After the termination the elementary decoder 1 (202) and elementary decoder 2 (204) are free to start decoding of a new received data, or may be left idle to save power consumption. Alternatively the stopping decision unit (206) can terminate elementary decoder 1 (202) and elementary decoder 2 (204) by causing the decoded data (114) to be extracted from the turbo decoder system (112) by a suitable extraction mechanism (not shown). After the extraction it may be convenient for the architecture of the turbo decoder system (112) to leave elementary decoder 1 (202) and elementary decoder 2 (204) computing. The latter approach will improve latency but may be less suitable for power consumption reduction.

Figure 3:
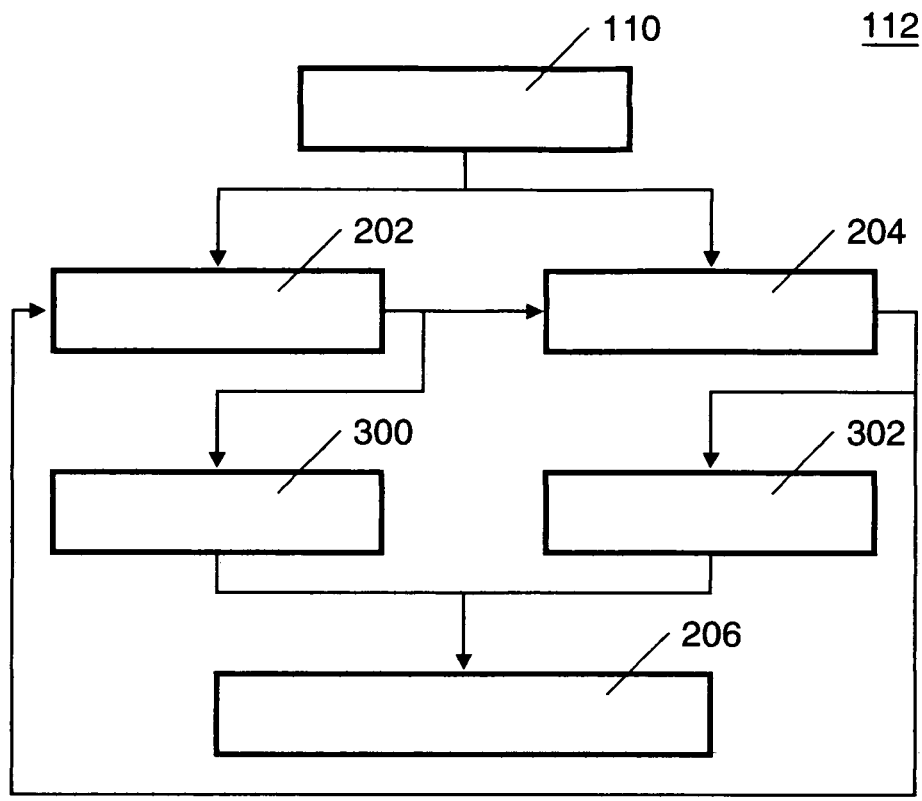
FIG. 3 is a block diagram illustrating a second embodiment of the decoder system according to the invention.

FIG. 3 describes an alternative embodiment of turbo decoder system (112). It contains all the elements of the FIG. 2 and, in addition, a hard data unit 1 (300) and a hard data unit 2 (302). Hard data unit 1 (300) is arranged to receive the output of elementary decoder 1 (202). The output of elementary decoder 1 (202) represents soft data and hard data unit 1 (300) is capable of converting the soft data into hard data. Likewise hard data unit 2 (302) is arranged to receive the output of elementary decoder 2 (204). The output of elementary decoder 2 (204) represents soft data and hard data unit 2 (302) is capable of converting it into hard data.

In this embodiment the stopping decision unit (206) is arranged to receive hard data from hard data unit 1 (300) and hard data unit 2 (302) instead of soft data.

An advantage of deciding on termination using hard data instead of soft data can be that hard data corresponds to the final output of the decoder; as a result it is easier to take into account consideration of processing steps done after the turbo decoding. Also considerations on hard data correspond better to numbers of errors and are in this regard better predictable.

Note that in general the stopping decision unit (206) may receive hard data for some elementary decoders and soft data for others. This may be advantageous if hard data is already available for some other reason. This arrangement may also have architectural advantages.

Figure 4:
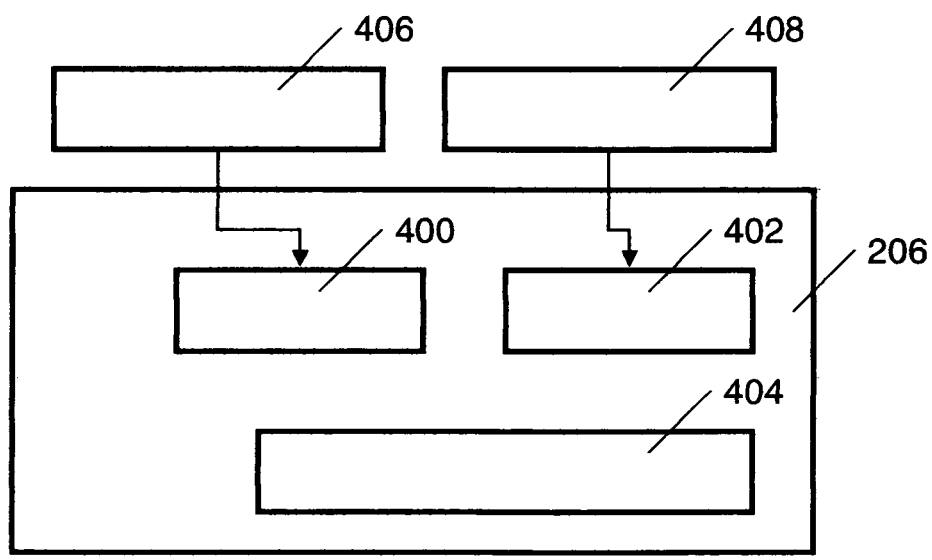
FIG. 4 is a block diagram illustrating an embodiment of a stopping unit.

FIG. 4 describes an embodiment of a stopping decision unit (206). The stopping decision unit (206) is arranged to receive output from elementary decoder 1 and output from elementary decoder 2, these outputs may either represent hard data or soft data. The stopping decision unit (206) comprises a memory 1 (400) and a memory 2 (402). In order to keep track of which data is needed and which memory can be used it is most advantageously to arrange both the memory 1 (400) and the memory 2 (402) as a queue, such as a First In First Out buffer (FIFO buffer). The stopping decision unit (206) comprises stopping decision logic (404).

The size of the memory 1 (400) and memory 2 (402) depend on the embodiment of the method chosen. In general the memories should be able to contain a representation of the soft data output of an elementary decoder, or the memories should be able to contain a representation of the hard data corresponding to the output of an elementary decoder. In case the stopping decision unit is configured to take into account more of the sequence of outputs of an elementary decoder the memory 1 (400) and memory 2 (402) need to be correspondingly larger.

In operation the stopping decision unit receives an output from elementary decoder 1 (202) or elementary decoder 2 (204). A representation of the received output from elementary decoder 1 (202) is stored in the memory 1 (400). A representation of the received output from elementary decoder 2 (204) is stored in the memory 2 (402). If necessary, information that is no longer needed for the application of the method can be overwritten.

As each new output is received the stopping decision logic (404) determines if the elementary decoding operations need to be terminated. It applies at least one criterion; for example, it applies the method of the invention. If the decoding operations have not been terminated yet it may also apply a number of other criteria. For example it may decide to terminate based on the number of iterations that happened so far. It may also apply other criteria.

The order in which the stopping decision logic (404) applies its criteria can be varied, e.g., it could first start using as a criterion the number of iterations and then apply other criteria, such as a method according to the invention.

The stopping decision unit may refrain from deciding to terminate during some elementary decoding operations, for example, it may skip the first or first few elementary decoding operations, as the chances of terminating the elementary decoding operations is small during those elementary decoding operations as compared to later elementary decoding operations.

Stopping decision logic (404) implements an embodiment of the method of the invention using dedicated hardware, such as electronic circuits that are configured to perform the method or the stopping decision logic (404) can be made from generic hardware controlled using software, or the stopping decision logic (404) may comprise a combination of dedicated hardware, generic hardware and software to implement the method of the invention.

Figure 5:
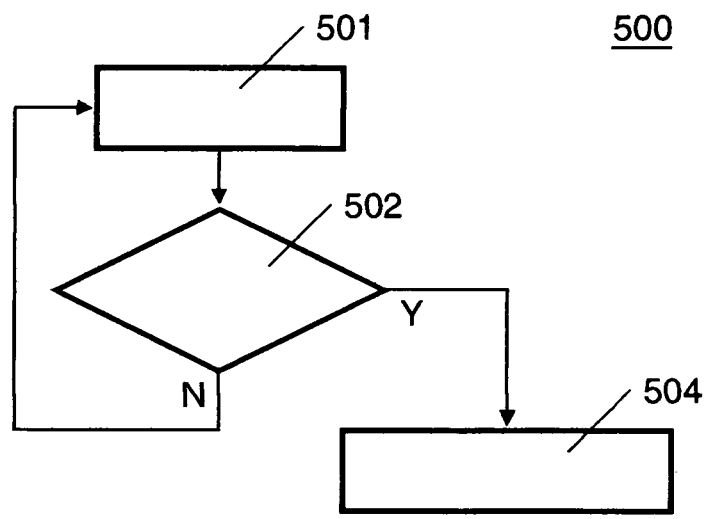
FIG. 5 is a flowchart illustrating a first embodiment of the method for stopping execution of a turbo decoder according to the invention.

FIG. 5 is a flowchart illustrating an embodiment (500) of the method of the invention. The starting point of the method is when any of the elementary decoders performs a specific elementary decoding operation (501). This specific elementary decoding operation was performed by a specific elementary decoder. To this specific elementary decoder corresponds a specific sequence of elementary decoding operations. The specific sequence of elementary decoding operations includes the specific elementary decoding operation (501). It is then determined if the specific sequence of elementary decoding operations has substantially converged or substantially diverged (502). If the specific sequence of elementary decoding operations has substantially converged or substantially diverged (502) then the embodiment decides to terminate (504) the elementary decoding operations, if not the test is applied after the next elementary decoding operation.

There are various ways in which the method can determine if the specific sequence has substantially converged or substantially diverged. These are discussed below.

Figure 6:
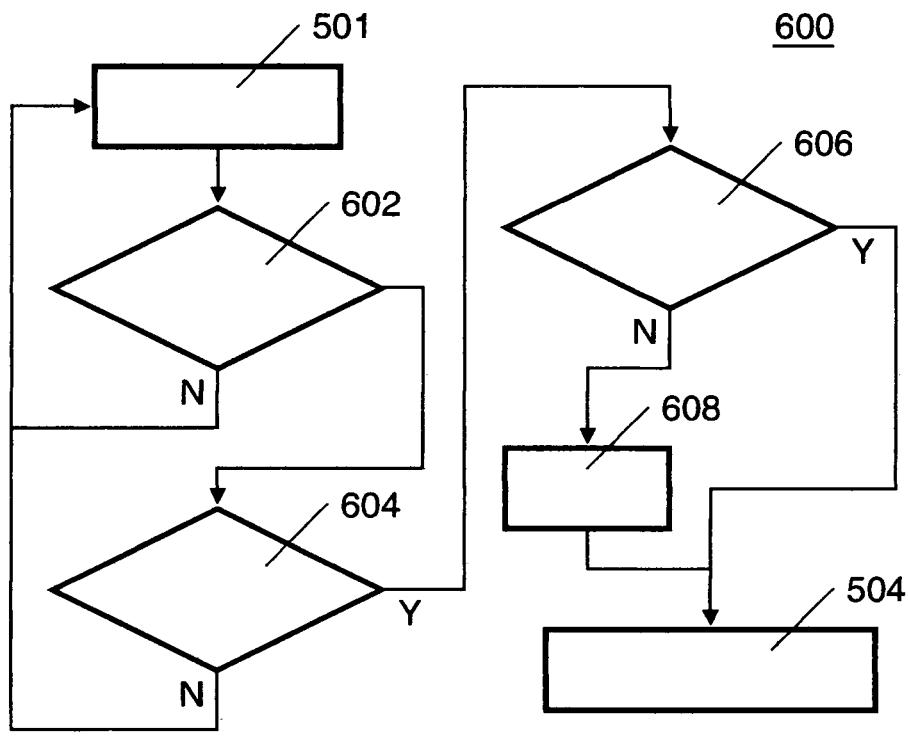
FIG. 6 is a flowchart illustrating a second embodiment of the method for stopping according to the invention.

FIG. 6 is a flowchart illustrating additional steps (600) that can be performed in conjunction with the method of the invention. The starting point of the additional steps is when any of the elementary decoders performs a specific elementary decoding operation (501). This specific elementary decoding operation was performed by a specific elementary decoder. To this specific elementary decoder corresponds a specific sequence of elementary decoding operations. The specific sequence of elementary decoding operations includes the specific elementary decoding operation (501). It is then determined if the specific sequence of elementary decoding operations has substantially converged (602). If so, it is determined whether the sequence of elementary decoding operations corresponding to the elementary decoder that was active previously to the specific elementary decoder has also converged (604). If so it is verified if both sequences converged to the same data (606). If both sequences did not converge to the same data then report a failure (608). In case both sequences converged, irrespective whether they converged to the same data or not, the method then terminates the decoding operations (504).

The advantage of these additional steps is that situations are recognized in which a turbo decoder is 'stuck'. If two or more sequences of elementary decoding operations have converged it is not likely that the situation will change by further computations, probably none of the converged data is likely to correspond to the original data (106).

As a result a turbo decoder system (112) in which this method is used avoids computing in situations that are already hopeless. By terminating the elementary decoding operations early a communication system comprising the turbo decoder system (112) has, e.g., the option to request a resend of the data quicker, thereby increasing the latency of such a communication system. Also power consumption is reduced since fewer computations are performed.

This approach is especially advantageous if it is verified that all sequences of elementary decoding operations have converged. As in that situation it is especially unlikely that further computations are useless.

Figures 7, 8, 9:
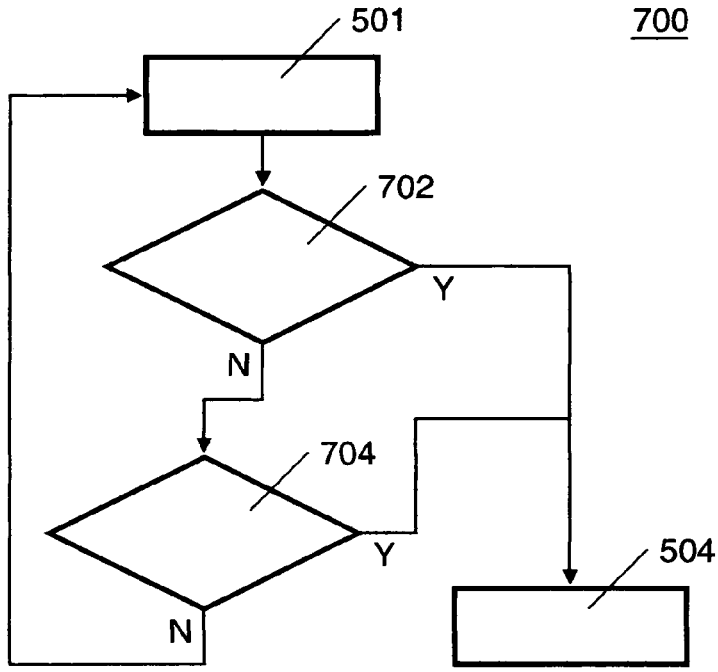
FIG. 7 is a flowchart illustrating a third embodiment of the method for stopping according to the invention.
FIG. 8 gives various equations representing various aspects of embodiments of the method for stopping according to the invention.
FIG. 9 gives further equations representing various aspects of embodiments of the method for stopping according to the invention.

FIG. 7 is a flowchart illustrating further additional steps (700) that can be performed in conjunction with the method of the invention. The starting point of the further additional steps is when any of the elementary decoders performs a specific elementary decoding operation (501). This specific elementary decoding operation was performed by a specific elementary decoder. To this specific elementary decoder corresponds a specific sequence of elementary decoding operations. The specific sequence of elementary decoding operations includes the specific elementary decoding operation (501). It is then determined if the specific sequence of elementary decoding operations substantially agrees (702) with the sequence of elementary decoding operations corresponding to the elementary decoder that was active previously to the specific elementary decoder. If so the decoding operations are terminated (504).

This embodiment shows a convenient way of finding two sequences that converge. After each elementary decoding, convergence is estimated of the corresponding sequence. In a memory (not shown) it is stored for each sequence if it has, so far, converged or not. By consulting the memory it can be determined if two sequences have converged. In this way, the method can be implemented without needing much memory. Alternative arrangements are also possible. For example, an embodiment could keep track of convergence only for two particular sequences corresponding to two particular elementary decoders, such as to the last two elementary decoders.

If the decoding operations were not terminated, then other reasons for terminating can be tried (704), such as those specified in the embodiments above.

The advantage of this method is that even if none or not all of the sequences have converged it is probably advantageous to terminate if two sequences substantially agree. It would be unlikely that two elementary decoders would agree by chance, it is more likely that they agree because both have found a good approximation to the original data (106).

An advantage of this method is that it combines different criteria for terminating the elementary decoding operations. Since testing for termination is relatively cheap compared to an extra elementary decoding operation it is opportune to test more than one criteria to maximize the probability of early stopping.

In general in the order of the various steps in all of these embodiments can be varied. In particular, steps (702) and (704) can be interchanged.

FIG. 8 gives various equations representing various aspects of embodiments of the method according to the invention based on hard data.

In all equations of FIG. 8, the letter 'X' refers to the sequence of elementary decoding operations corresponding to the specific elementary decoding operations (501). The letter 'A' refers to the sequence of elementary decoding operations corresponding to elementary decoder 1 (202). The letter 'B' refers to the sequence of elementary decoding operations corresponding to elementary decoder 2 (204). The index 'n' refers to the most recent elementary decoding operation of the elementary decoder it corresponds to. For example, '$A_n$' refers to the most recent elementary decoding of elementary decoder 1 (202). Similarly '$A_{n-1}$' refers to the second most recent (i.e. the one immediately preceding the most recent) elementary decoding of elementary decoder 1 (202).

It is noted that if an equation refers to a result that is not yet available, for example, '$A_{n-1}$' in the first iteration, the method is simply skipped, and no termination is done for that reason.

All equations of FIG. 8 are related to hard data. The equality sign '=' means substantially equal. "Substantially equal" must be interpreted with respect to the block size of the turbo code, to the number of errors it can correct, and to the operations that may follow the turbo decoding. In case the turbo decoder is followed by a second other decoder, such as a BCH decoder (a Bose-Chaudhuri-Hocquenghem decoder) the number of errors the BCH decoder can correct can be taken as a measure of substantially equal.

Using the equations of (801), (802) the method will terminate if the specific sequence has substantially converged. In (801) only the previous data is taken into account to determine convergence. In (802) more data is taken into account.

The equations of (803), (804) or (805) can be used to determine substantial agreement. As more data agrees, the sequences are more likely to be in real agreement as opposed to a chance agreement.

In the equations (801) to (805) the advantage of taking more data into account is that it becomes less likely to make a wrong termination decision. This will help the robustness. The advantage of taking fewer data into account is that termination will be decided on earlier. Deciding between these equations allows one to achieve a different balance between latency and robustness.

The equations (806) to (810) combine the previous equations in various ways, that is, they combine substantial convergence of the specific sequence with substantial agreement of two sequences. Since two criteria are combined when deciding upon termination, such a termination will, on average, happen earlier. If either criterion occurs the method decides to terminate the elementary decoding operations.

Note that since the elementary decoders need not all be of the same type, it may be advantageous to employ a different stopping rule after each elementary decoding step. For example, should it be known that one elementary decoder converges fast, for example, because it can correct more errors, it may be decided that it has converged, for example, by taking rule (801) for that elementary decoder but (802) for others.

Substantial divergence can be determined in similar ways. For example, if instead of equality in (802) there is a difference, and this difference is larger than a predetermined value, divergence may be assumed. Or, as an example, if in equation (802) instead of two equalities there are two differences and the more recent difference is larger than less recent difference.

Substantial agreement or substantial convergence can also be decided upon by operation upon soft data. For a person skilled in the art it is clear how the above equations can be adapted to use soft data. In particular, a sequence of elementary decoding operation can be considered converged if the sum of all bit reliabilities converges. Two sequences of elementary decoding operations can be considered to be in substantial agreement if the sum of the absolute value of the differences between the two sequences of the probabilities concerning the original data (106), such as comprised in soft data converges to 0. Instead of the sum other mathematical function can be used, preferably convex functions, such as a sum of powers, such as squares.

It should be evident to one with ordinary skills in the art that many combinations of these equations are possible, within the scope of the present invention.

Equation (801) can be used to establish substantial convergence and can be applied as follows. After each specific elementary decoding of a specific decoder (such as (202), (204) or any other elementary decoder that may be present) it is determined if the hard data corresponding to the specific elementary decoding (i.e. the recent decoding) is equal to the hard data corresponding to the second most recent (i.e. the one immediately preceding the most recent) decoding of the specific decoder. When it is such determined the execution of elementary decodings is terminated.

An equivalent formulation of equation (801) is given in equation (901). 'Equal' and '=' in equation (801), (901) or any other of the equations of FIG. 8 and FIG. 9 and the descriptions thereof can be embodied as exactly equal. 'Equal' can alternatively also be embodied as substantially equal.

Equation (802) can be used to establish substantial convergence and can be applied as follows. After each specific elementary decoding of a specific decoder (such as (202), (204) or any other elementary decoder that may be present) it is determined if the hard data corresponding to the recent, second most recent and third most recent elementary decoding of the specific decoder are equal. When it is such determined the execution of elementary decodings is terminated.

Equation (803) can be used to establish substantial agreement and can be applied as follows. After each specific elementary decoding of a specific decoder (such as (202), (204) or any other elementary decoder that may be present) it is determined if the hard data corresponding to the recent, elementary decoding of the specific decoder is equal to the hard data corresponding to the most recent elementary decoding of another elementary decoder. When substantial agreement is established the execution of elementary decodings is terminated.

Equation (804) can be used to establish substantial agreement and can be applied as follows. After each specific elementary decoding of a specific decoder (such as (202), (204) or any other elementary decoder that may be present) it is determined if the hard data corresponding to the specific elementary decoding (i.e. the recent decoding) is equal to the hard data corresponding to the second most recent (i.e. the one immediately preceding the most recent) decoding of the specific decoder. It is also determined if a recent particular decoding of a particular decoder (such as (202), (204) or any other elementary decoder that may be present) is equal to the hard data corresponding to the second most recent (i.e. the one immediately preceding the most recent) decoding of the particular decoder. Moreover it is determined if the recent specific elementary decoding is equal to the recent particular elementary decoding. The specific decoder is not equal to the particular decoder. When substantial agreement is established the execution of elementary decodings is terminated.

Equation (805) can be used to establish substantial agreement and can be applied as follows. After each specific elementary decoding of a specific decoder (such as (202), (204) or any other elementary decoder that may be present) it is determined if the hard data corresponding to the specific elementary decoding (i.e. the recent decoding) is equal to the hard data corresponding to the second most recent (i.e. the one immediately preceding the most recent) decoding and to the third most recent of the specific decoder. It is also determined if a recent particular decoding of a particular decoder (such as (202), (204) or any other elementary decoder that may be present) is equal to the hard data corresponding to the second most recent (i.e. the one immediately preceding the most recent) decoding and to the third most recent of the particular decoder. Moreover it is determined if the recent specific elementary decoding is equal to the recent particular elementary decoding. The specific decoder is not equal to the particular decoder. When substantial agreement is established the execution of elementary decodings is terminated.

Equation (806) can be applied as a stopping criterion. When substantial convergence is established for one elementary decoder in the way as described for equation (801) or substantial agreement is established in the way as described for equation (803), the execution of elementary decodings is terminated. An equivalent formulation of equation (806) is given in equation (902).

Equation (807) can be applied as a stopping criterion. When substantial convergence is established for two elementary decoders in the way as described for equation (801) or substantial agreement is established in the way described for equation (803) the execution of elementary decodings is terminated.

Equation (808) can be applied as a stopping criterion. When substantial convergence is established for two elementary decoders in the way as described for equation (801) or substantial agreement is established in the way described for equation (804) the execution of elementary decodings is terminated.

Equation (809) can be applied as a stopping criterion. When substantial convergence is established for two elementary decoders in the way as described for equation (802) or substantial agreement is established in the way described for equation (804) the execution of elementary decodings is terminated.

Equation (810) can be applied as a stopping criterion. When substantial convergence is established for two elementary decoders in the way as described for equation (802) or substantial agreement is established in the way described for equation (805) the execution of elementary decodings is terminated.

The present invention, as described in embodiments herein, may be implemented using a programmed processor executing programming instructions that are broadly described above in flow chart form that can be stored on any suitable electronic storage medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping, enhancements and variations can be added without departing from the present invention. Such variations are contemplated and considered equivalent.

The present invention could be implemented using special purpose hardware and/or dedicated processors. Similarly, general purpose computers, microprocessor based computers, digital signal processors, microcontrollers, dedicated processors, custom circuits, ASICS and/or dedicated hard wired logic may be used to construct alternative equivalent embodiments of the present invention.

Those skilled in the art will appreciate that the program steps and associated data used to implement the embodiments described above can be implemented using disc storage as well as other forms of storage, such as, for example, Read Only Memory (ROM) devices, Random Access Memory (RAM) devices, optical storage elements, magnetic storage elements, magneto-optical storage elements, flash memory and/or other equivalent storage technologies without departing from the present invention. Such alternative storage devices should be considered equivalents.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

The invention claimed is:

1. A method for stopping execution of a turbo decoder wherein said turbo decoder comprises:
a plurality of elementary decoders, wherein:
each respective one of the elementary decoders is configured for performing a respective sequence of decoding operations, and
each respective one of the elementary decoders is arranged to receive a respective input from at least one other of the plurality of elementary decoders;
wherein said method for stopping comprises:
applying for each specific decoding operation in a specific sequence of decoding operations of a specific elementary decoder;
determining if the specific sequence of decoding operations of the specific elementary decoder has substantially converged or substantially diverged;
terminating the execution of decoding operations if a number of sequences including the specific sequence has substantially converged or substantially diverged; and
determining if a first sequence of decoding operations has converged to a first data, and if so;
determining if a second sequence of decoding operations has converged to a second data, and if so;
verifying that the first data and the second data are not equal, and if so;
reporting that the turbo decoder has failed.

2. The method as in claim 1, wherein the number of sequences is one.

3. The method as in claim 1, wherein the number of sequences is at least two.

4. The method as in claim 1, further comprising:
determining if a first sequence of decoding operations substantially agrees with a second sequence of decoding operations, and if so,
terminating the execution of decoding operations.

5. A turbo decoder system comprising:
a plurality of elementary decoders, wherein
each respective one of the elementary decoders is configured for performing a respective sequence of decoding operations,
each respective one of the elementary decoders is arranged to receive a respective input from at least one other of the plurality of elementary decoders, and a stopping decision unit, and
said stopping decision unit is at least configured to execute the following method:

applying for each specific decoding operation in a specific sequence of decoding operations of a specific elementary decoder;

determining if the specific sequence of decoding operations of the specific elementary decoder has substantially converged or substantially diverged; and terminating the execution of decoding operations if a number of sequences including the specific sequence has substantially converged or substantially diverged; and determining if a first sequence of decoding operations has converged to a first data, and if so, determining if a second sequence of decoding operations has converged to a second data, and if so, verifying that the first data and the second data are not equal, and if so, reporting that the turbo decoder has failed.

* * * * *

UNITED STATES PATENT AND TRADEMARK OFFICE
CERTIFICATE OF CORRECTION

PATENT NO.       : 8,707,146 B2
APPLICATION NO.  : 12/865702
DATED            : April 22, 2014
INVENTOR(S)      : Charpentier et al.

It is certified that error appears in the above-identified patent and that said Letters Patent is hereby corrected as shown below:

In The Specification

In Column 6, Line 15-16, delete "receiver (110)" and insert -- receiver (104) --, therefor.

In Column 10, Line 3, delete "operations (504)." and insert -- operations (501). --, therefor.

Signed and Sealed this
Nineteenth Day of July, 2016

Michelle K. Lee
*Director of the United States Patent and Trademark Office*